(12) United States Patent
Kuttner (10) Patent No.: US 9,312,824 B2
(45) Date of Patent: Apr. 12, 2016

(54) LOW NOISE LOW-DROPOUT REGULATOR

(71) Applicant: Intel Deutschland GmbH, Neubiberg (DE)

(72) Inventor: Franz Kuttner, St. Ulrich (AT)

(73) Assignee: Intel Deutschland GmbH, Neubiberg (DE)

( * ) Notice: Subject to any disclaimer, the term of this patent is extended or adjusted under 35 U.S.C. 154(b) by 126 days.

(21) Appl. No.: 14/155,291

(22) Filed: Jan. 14, 2014

(65) Prior Publication Data

US 2015/0198959 A1  Jul. 16, 2015

(51) Int. Cl.
*G05F 1/00* (2006.01)
*H03F 3/45* (2006.01)
*G05F 1/575* (2006.01)

(52) U.S. Cl.
CPC ............ *H03F 3/45071* (2013.01); *G05F 1/575* (2013.01); *H03F 3/45183* (2013.01); *H03F 2203/45652* (2013.01)

(58) Field of Classification Search
CPC .......... G05F 1/575; G05F 1/56; G05F 1/573; G05F 3/18; G05F 3/30; G05F 3/262
USPC ........... 323/273–281, 311–317; 327/536–541
See application file for complete search history.

(56) References Cited

U.S. PATENT DOCUMENTS

| | | | |
|---|---|---|---|
| 6,040,736 A * | 3/2000 | Milanesi | G05F 1/575 323/316 |
| 6,188,212 B1 | 2/2001 | Larson et al. | |
| 6,842,068 B2 * | 1/2005 | Perrier | G05F 1/575 323/280 |
| 7,619,402 B1 | 11/2009 | Kwong | |
| 2005/0225380 A1 | 10/2005 | Ingino, Jr. | |
| 2007/0241728 A1 | 10/2007 | Demolli | |
| 2009/0121693 A1 * | 5/2009 | Noda | G05F 1/56 323/273 |
| 2011/0062922 A1 | 3/2011 | Wang | |

OTHER PUBLICATIONS

International Search Report and Written Opinion mailed Feb. 27, 2015, issued in corresponding International Application No. PCT/US2014/066526, 11 pages.

* cited by examiner

*Primary Examiner* — Nguyen Tran
(74) *Attorney, Agent, or Firm* — Schwabe, Williamson & Wyatt, P.C.

(57) ABSTRACT

Representative implementations of devices and techniques provide a regulator having a high regulation speed and low noise across a wide frequency range. A pass through device outputs a regulated voltage based on a control signal output by an error amplifier. The control signal is boosted via a regulated boost signal.

26 Claims, 6 Drawing Sheets

LOW NOISE LOW-DROPOUT REGULATOR

BACKGROUND

Various electronic devices may have reduced power consumption by operating some of the systems within these devices at lower voltages (e.g., 3.0 volts, 1.5 volts, etc.). A power supply management module within such devices can convert an input voltage to several supply domains with different output voltages and requirements. For example, various digital or analog components or modules might have different supply voltage specifications, each operating at a different supply voltage. Such devices or systems can often have several different power supply domains.

Power conversion between input and output voltages can be done with low-dropout regulators (LDOs). LDOs are generally efficient at low voltages and can provide a regulated output using input-output voltages having a small differential. A regulated output from a LDO is commonly based on a comparison of a feedback signal from the output of the regulator to a reference voltage.

For many applications, thermal noise generated by the LDO should be small, whereas the regulation speed should be high to allow the LDO to follow fast load jumps. In some cases, using a multiple-stage amplifier improves the gain of the regulator. However, the usable bandwidth is often restricted to lower the noise, particularly for higher frequencies, thus limiting the performance of the regulator for load jumps. For higher frequencies, a single-stage amplifier can have reduced noise, but the limited gain of a single-stage amplifier can result in static errors.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Representative implementations of devices and techniques provide a regulator having a high regulation speed and low noise across a wide frequency range. In various implementations, a pass through device of the regulator outputs a regulated voltage based on a control signal output by an error amplifier. In an exemplary implementation, the control signal is boosted in magnitude via a regulated boost signal. In various implementations, the result is a regulator having low noise, including at high frequencies, and high gain and regulation speed.

In one exemplary implementation, a pass through device such as a transistor for example, is arranged to receive an input voltage and to output a regulated voltage based on a control signal at a gate of the pass through device. An error amplifier is arranged to receive a reference voltage at one input and a feedback voltage at another input, and to output the control signal based on the difference between the reference voltage and the feedback voltage. In an example, the error amplifier comprises a single-stage operational amplifier.

In an exemplary implementation, a capacitance such as a flying capacitor for example, is coupled to an output of the error amplifier. In the implementation, the capacitance is arranged to receive a boost signal from a signal source and to increase the magnitude of the control signal based on the boost signal. In one example, the signal source comprises a boost amplifier such as an operational amplifier for example, arranged to regulate the magnitude of the boost signal. For instance, the boost signal may be regulated in such a way that the differential output voltage of the error amplifier is set to zero. In the example, the boost amplifier receives a differential signal at its differential inputs that is a balanced output from the error amplifier.

Various implementations, including techniques and devices, are discussed with reference to the figures. The techniques and devices discussed may be applied to any of various regulator designs, circuits, and devices and remain within the scope of the disclosure.

Advantages of the disclosed techniques and devices are varied, and include (according to multiple implementations): 1) the systematic offset of the error amplifier can be zero, when the error amplifier is balanced; 2) the low frequency loop gain of the regulator equals the gain of the differential stage (the error amplifier) multiplied by the gain of the second amplifier (the boost amplifier); 3) noise at high frequencies is determined by thermal noise of the error amplifier, since the boost amplifier does not contribute to the noise of the regulator; and 4) there can be little to no stability problem with the regulator for all frequencies (including higher frequencies) when the main loop includes a single-stage amplifier (the error amplifier). Other advantages of the disclosed techniques may be apparent in the disclosure, based on the techniques and/or devices discussed.

One exemplary implementation according to a first aspect provides apparatus, comprising: a pass through device arranged to receive an input voltage and to output a regulated voltage based on a control signal at a gate of the pass through device; an error amplifier arranged to receive a reference voltage and a feedback voltage and to output the control signal based on a difference between the reference voltage and the feedback voltage; a capacitance arranged to receive a boost signal and to increase a magnitude of the control signal based on the boost signal; and a boost signal source arranged to regulate a magnitude of the boost signal.

The apparatus according to the first aspect provides the error amplifier comprising a single-stage operational amplifier.

The apparatus according to the first aspect provides the feedback voltage that is based on at least a portion of the regulated voltage.

The apparatus according to the first aspect provides the boost signal source that is arranged to receive a balanced differential signal output at the error amplifier, the balanced differential signal comprising a pair of inverted signals with substantially equal magnitudes.

The apparatus according to the first aspect provides the boost signal source that comprises an operational amplifier, and differential inputs to the operational amplifier comprise differential outputs of the error amplifier.

The apparatus according to the first aspect provides the differential outputs of the error amplifier comprise at least a portion of a balanced circuit.

One implementation according to a second aspect provides low drop out voltage regulator, comprising: an error amplifier having a first input coupled to a reference voltage and a second input coupled to a feedback voltage, an output of the voltage regulator based on a control signal output from the error amplifier; a capacitance coupled to an output of the error amplifier and arranged to increase a magnitude of the control signal based on receiving a boost signal; and a boost amplifier having a first input coupled to a first output of the error amplifier and a second input coupled to a second output of the error amplifier, an output of the boost amplifier comprising the boost signal.

The low drop out voltage according to the second aspect further comprises a transistor device arranged to receive an input voltage and to output a regulated voltage based on the control signal.

The low drop out voltage regulator according to the second aspect provides the transistor device having an N-channel pass transistor device.

The low drop out voltage regulator according to the second aspect further comprises a voltage regulation loop coupled to the second input of the error amplifier and arranged to provide the feedback voltage, based on the output of the voltage regulator.

The low drop out voltage regulator according to the second aspect further comprises a voltage divider arranged to output the feedback voltage.

The low drop out voltage regulator according to the second aspect includes that a low frequency loop gain of the low drop out voltage regulator comprises a gain of the error amplifier multiplied by a gain of the boost amplifier.

The low drop out voltage regulator according to the second aspect provides that the error amplifier comprises a single-stage operational amplifier.

The low drop out voltage regulator according to the second aspect provides a first output signal at the first output of the error amplifier is substantially equal in magnitude and opposite in polarity to a second output signal at the second output of the error amplifier.

The low drop out voltage regulator according to the second aspect provides the boost amplifier that comprises an operational amplifier arranged to regulate the boost signal.

The low drop out voltage regulator according to the second aspect provides the boost amplifier that does not contribute to high frequency thermal noise of the low drop out voltage regulator.

The low drop out voltage regulator according to the second aspect provides at least one of the error amplifier and the boost amplifier are comprised of a symmetric set of complementary metal-oxide-semiconductor (CMOS) transistor pairs.

The low drop out voltage regulator according to the second aspect provides the error amplifier and the boost amplifier comprise electrically equivalent devices.

One exemplary implementation according to a third aspect provides a method of controlling a voltage regulator, comprising: passing a signal through a pass through device based on a control signal applied to the pass through device; generating the control signal at an error amplifier arranged to compare at least a portion of an output of the voltage regulator to a reference signal; augmenting a magnitude of the control signal with a boosting voltage applied to the control signal; and regulating the boosting voltage such that a differential output voltage of the error amplifier is set to zero.

The method according to the third aspect further comprises charging a capacitance with the boosting voltage and applying the boosting voltage to the control signal via the capacitance.

The method according to the third aspect further comprises boosting the magnitude of the control signal above a magnitude of an input signal to the pass through device.

The method according to the third aspect further comprises boosting the magnitude of the control signal to a value at or above a magnitude of the output of the voltage regulator plus a gate-to-source voltage of the pass through device.

The method according to the third aspect further comprises generating the boosting voltage at an operational amplifier, wherein differential inputs of the operational amplifier are coupled to differential outputs of the error amplifier, respectively.

The method according to the third aspect provides the differential outputs of the error amplifier that are set to output a balanced signal.

One exemplary implementation according to a fourth aspect provides a low dropout voltage regulator, comprising: an n-channel pass through transistor device arranged to receive an input voltage and to output a regulated voltage based on a control signal applied at a gate of the transistor device; an error amplifier having a first input coupled to a reference voltage and a second input coupled to a feedback voltage, the error amplifier arranged to output the control signal based on a difference between the reference voltage and the feedback voltage; a flying capacitance coupled to an output of the error amplifier and arranged to increase a magnitude of the control signal via a boost signal; and a boost amplifier having a first input coupled to a first output of the error amplifier and a second input coupled to a second output of the error amplifier, the boost amplifier arranged to regulate the boost signal based on a differential output voltage of the error amplifier set to zero.

Exemplary implementations are explained in more detail below using a plurality of examples. Although various implementations and examples are discussed here and below, further implementations and examples may be possible by combining the features and elements of individual implementations and examples.

Representative Regulator

Figure 1:
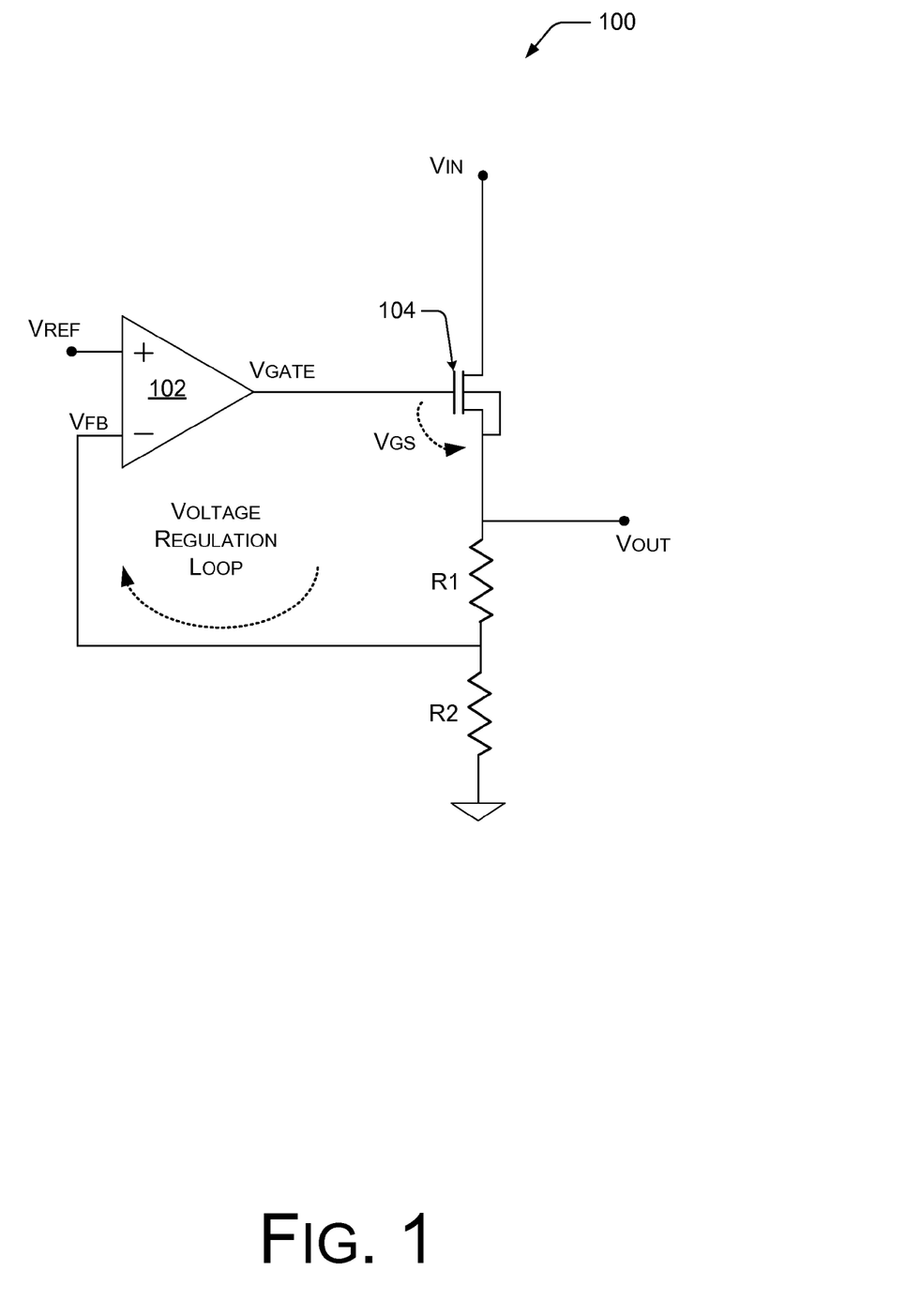
FIG. 1 is a schematic of an example regulator, such as a low-dropout regulator (LDO), in which the techniques in accordance with the present disclosure may be implemented.

FIG. 1 illustrates a representative low-dropout regulator (LDO) 100 in which the techniques in accordance with the present disclosure may be implemented. While the disclosure and drawings are discussed in terms of a low-dropout regulator (LDO), this is not intended as a limitation, and is for ease of discussion. The techniques and devices disclosed herein are applicable to various types of voltage and current regulators of various circuits and designs. Accordingly, the generic term "regulator" will be used hereinafter.

As shown in the illustration of FIG. 1, an example regulator 100 is powered by an input voltage $V_{IN}$ and produces an output voltage $V_{OUT}$. The output voltage $V_{OUT}$ is regulated based on a difference between a reference voltage $V_{REF}$ and a feedback voltage $V_{FB}$. An error amplifier 102 receives $V_{REF}$ and $V_{FB}$ at differential inputs and outputs a voltage potential $V_{GATE}$ based on a difference between the inputs. The error amplifier 102 may comprise an operational amplifier (op amp), or the like. In an alternate implementation, the error amplifier 102 may comprise an operational transconductance amplifier (OTA), or the like.

The voltage $V_{GATE}$ is arranged to operate the pass through device 104. For example, the voltage $V_{GATE}$ is arranged to allow current to pass from the input $V_{IN}$ to the output $V_{OUT}$. In an implementation, the regulated voltage $V_{OUT}$ is output via a voltage divider, for example, comprising a number of resistors (e.g., R1 and R2), as shown in FIG. 1. A feedback loop sends the regulated output voltage $V_{OUT}$ (e.g., a portion, a fraction, or a multiple of the output voltage) to one of the inputs of the error amplifier 102 as the feedback signal ($V_{FB}$). Thus, a voltage regulation loop includes the error amplifier 102, the pass through device 104, one or more resistors of the voltage divider (e.g., R1 and/or R2), and a feedback path from the voltage divider (regulator output) back to the error amplifier 102 (e.g., feedback voltage $V_{FB}$).

In various implementations, the pass through device 104 may be comprised of a transistor (e.g., field effect transistors (FETs), junction field effect transistors (JFETs), metal-oxide semiconductor FET transistors (MOSFETs), bipolar junction transistors (BJTs), etc.), and the like. In one implementation, the pass through device 104 comprises an N-channel transistor device. In the implementation, the N-channel transistor device may be used due to desirable loop stability properties of the device.

In an exemplary implementation, as shown in FIG. 1, the pass through device 104 comprises a source-follower device with low output impedance and a gain of approximately one. In the exemplary implementation, the impedance and gain properties may be desirable since they allow the pass through device 104 to be substantially transparent to the regulated signal. In alternate implementations, other types and configurations of transistors may be used for a pass through device 104. In an exemplary implementation, the pass through device 104 is arranged to receive an input voltage $V_{IN}$ and to output a regulated voltage $V_{OUT}$ based on the control signal $V_{GATE}$ at a gate of the pass through device 104.

In some exemplary implementations, when an N-channel transistor is used as the pass through device 104, the gate voltage $V_{GATE}$ is set to a value at or above a magnitude of the regulated output voltage ($V_{OUT}$) of the voltage regulator 100 plus the gate-to-source voltage ($V_{GS}$) of the pass through device 104. Additionally or alternately, the gate voltage $V_{GATE}$ may be set to a value above the magnitude of the input signal ($V_{IN}$) to the pass through device 104. In such exemplary implementations, it may be desirable for the gate voltage $V_{GATE}$ to be at or above one or both of the levels indicated, since the gate voltage $V_{GATE}$ is employed as a control signal for proper operation of the pass through device 104. In various implementations, the gate voltage (a.k.a. control signal) $V_{GATE}$ may be boosted, as discussed further below, to meet the desired voltage levels.

Example Implementations

Figure 2:
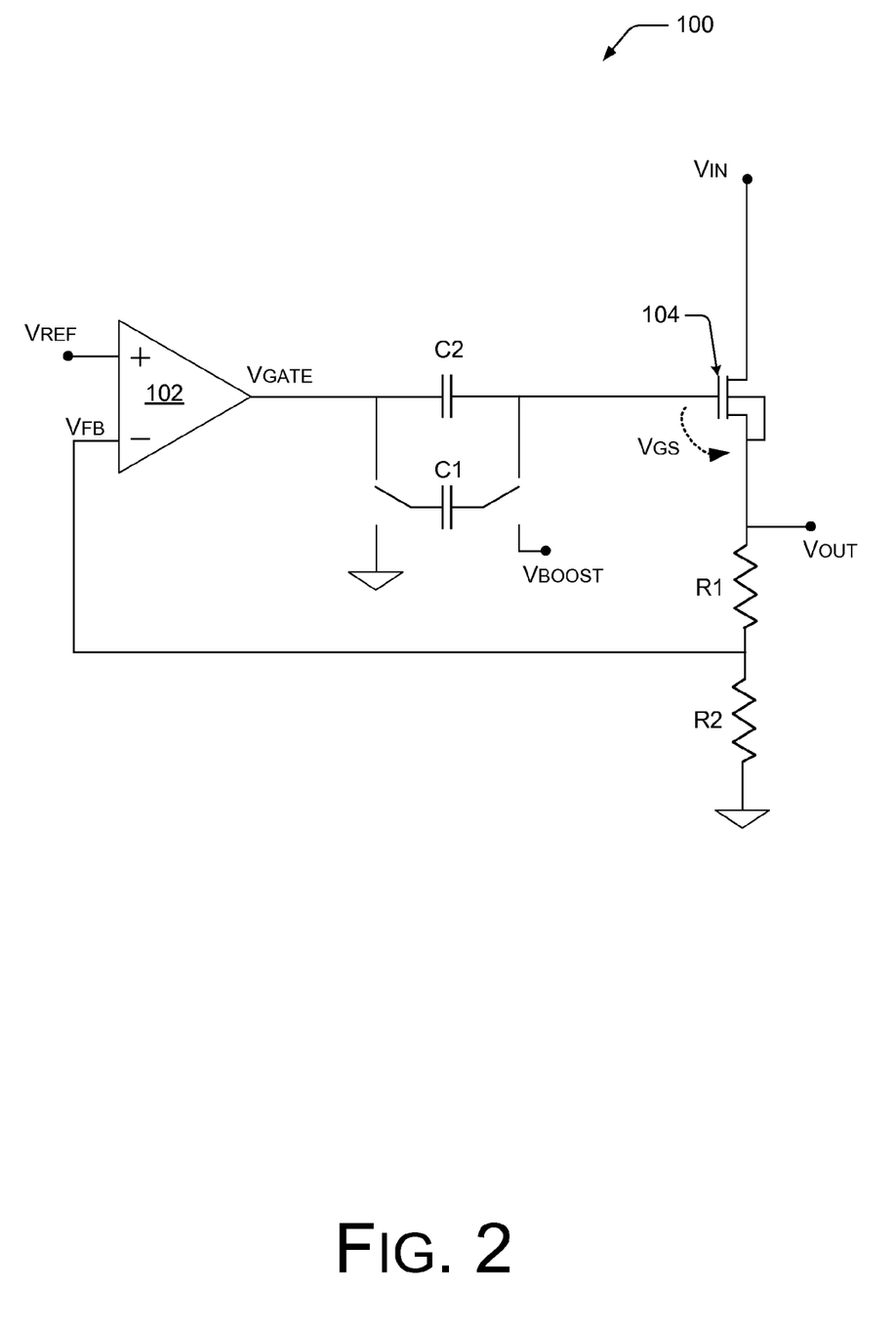
FIG. 2 is a schematic of the example regulator of FIG. 1, including a flying capacitance arranged to boost the gate voltage of the pass through device, according to an implementation.

FIG. 2 is a schematic of the example regulator 100 of FIG. 1, and including a flying capacitance C1 arranged to boost the control signal $V_{GATE}$ of the pass through device 104, according to an implementation. For example, in an implementation, the capacitance C1 is arranged to receive a boost signal $V_{BOOST}$ and to increase a magnitude of the control signal $V_{GATE}$ based on the boost signal $V_{BOOST}$. In the implementation, the capacitance C1 is arranged to boost the control signal $V_{GATE}$ to a value at or above the magnitude of the input signal $V_{IN}$ to the pass through device 104 and/or to a value at or above the magnitude of the output $V_{OUT}$ of the voltage regulator 100 plus the gate-to-source voltage $V_{GS}$ of the pass through device 104. In alternate implementations, the capacitance C1 is arranged to boost the control signal $V_{GATE}$ to other desired values.

In an implementation, as shown in FIG. 2, the capacitance C1 receives and is charged to the boost voltage $V_{BOOST}$ when the capacitance C1 is switched to the $V_{BOOST}$ terminals (e.g., $V_{BOOST}$ and ground). When C1 is switched away from the $V_{BOOST}$ terminals, and switched in parallel with the capacitance C2 (as illustrated in FIG. 2), the voltage on C1 is combined with the voltage on C2 (which is charged to the output voltage $V_{GATE}$ of the error amplifier 102), thereby increasing the magnitude of the control signal $V_{GATE}$. Accordingly, the boosted control signal $V_{GATE}$ is operative at the gate of the pass through device 104, to allow a desired current to pass from $V_{IN}$ to the regulated output $V_{OUT}$.

In various implementations, the boost voltage (or boost signal) $V_{BOOST}$ is supplied by a boost signal source, such as a local or remote voltage source, or the like. For example, the boost signal source may comprise a constant voltage source, or may include a variable source, based on the desired application. Additionally, switching control for the capacitance C1 may be provided by a local or remote control source, such as a processor, a controller, a logic circuit, a timing device, a sensor device, or the like, arranged to switch one or more switches associated with the capacitance C1, as shown in FIG. 2 and discussed above.

Figure 3:
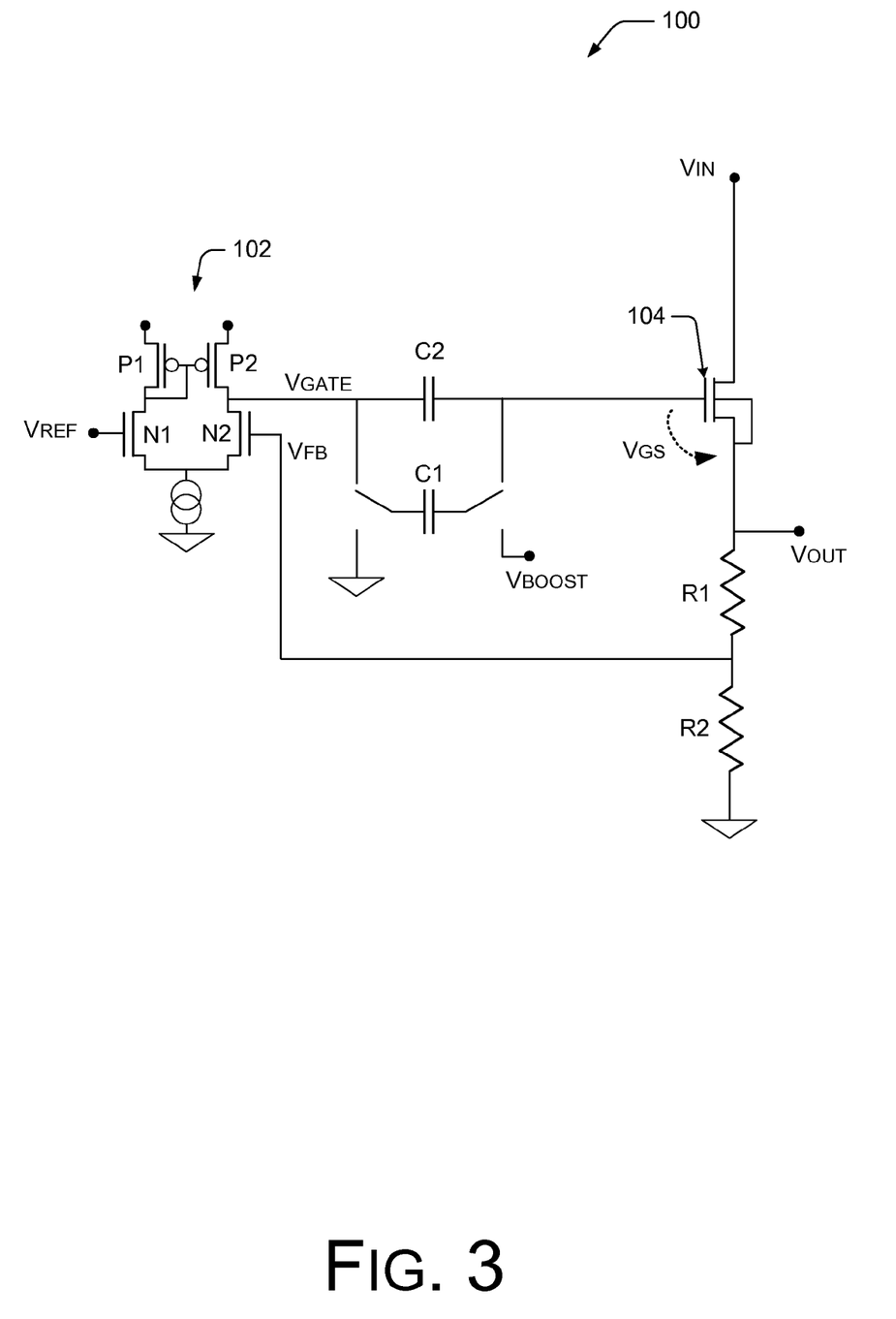
FIG. 3 is a schematic of the example regulator of FIG. 2, showing an example error amplifier construction, according to an implementation.

FIG. 3 is a schematic of the example regulator 100 of FIG. 2, showing detail of an example error amplifier 102 construction, according to an implementation. In one implementation, as shown in FIG. 3, the error amplifier 102 comprises a single-stage operational amplifier.

Also as shown in FIG. 3, in various implementations, the error amplifier 102 is comprised of a symmetric set of complementary metal-oxide-semiconductor (CMOS) transistor pairs (N1, P1 and N2, P2). In the implementations, the error amplifier 102 may comprise a balanced circuit, based on symmetric construction. In other words, the circuit may be balanced when the two sides (e.g., side 1 comprising N1 and P1 and side 2 comprising N2 and P2) have substantially equal transmission characteristics and/or the impedances of each side (side 1 and side 2) are equivalent.

Figure 4:
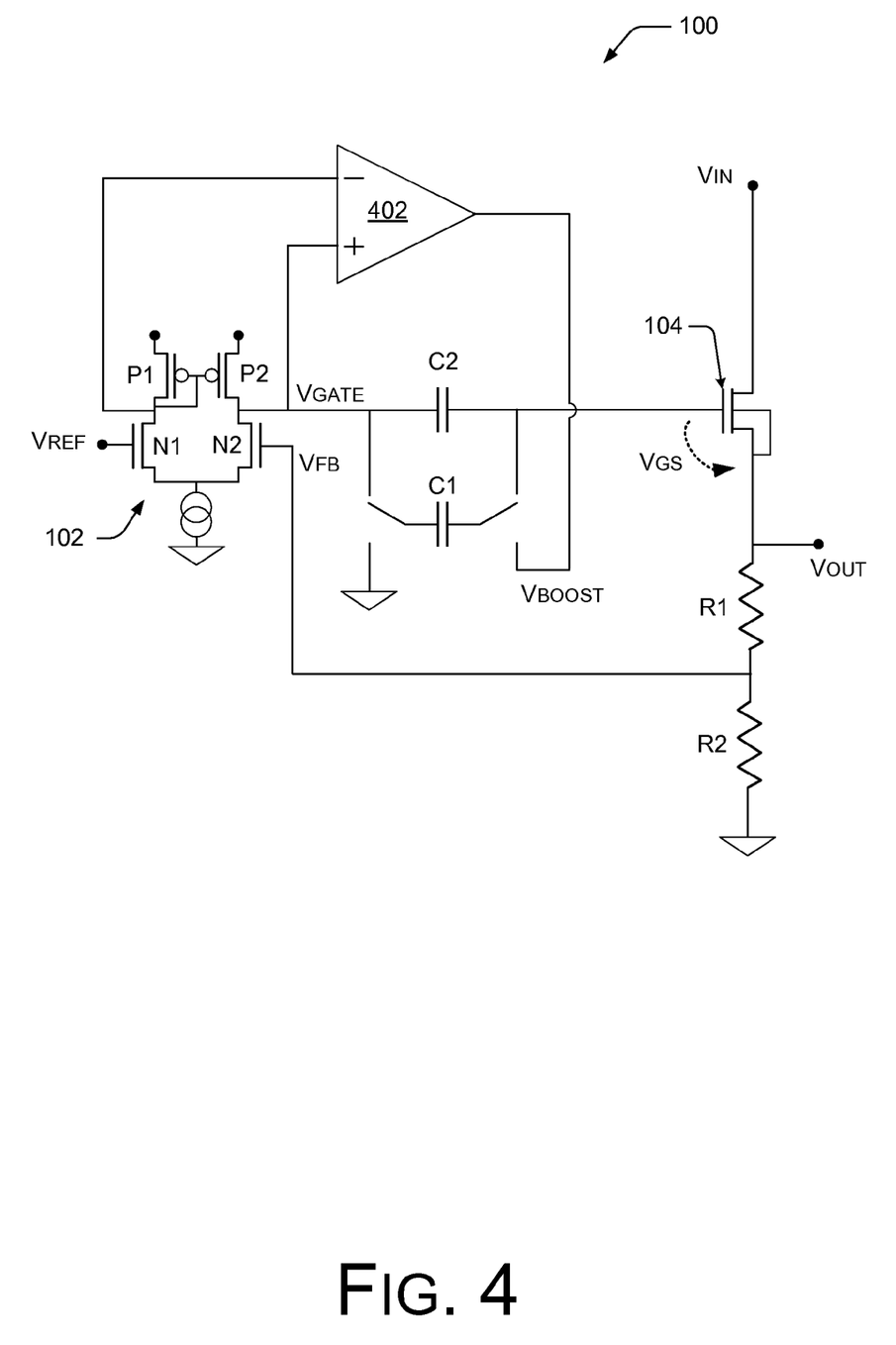
FIG. 4 is a schematic of the example regulator of FIG. 3, including a booster component, according to an implementation.

FIG. 4 is a schematic of the example regulator 100 of FIGS. 2 and 3, and including a booster component 402, according to an implementation. In various implementations, the boost signal source described above comprises the booster component 402. In other words, the booster component 402 is arranged to supply the boost voltage (or boost signal) $V_{BOOST}$ to the capacitance C1, for boosting the control signal $V_{GATE}$. In an implementation, the booster component 402 is arranged to supply and/or regulate the magnitude of the boost signal $V_{BOOST}$.

In various implementations, as shown in FIG. 4, the booster component 402 has a first input coupled to a first output of the error amplifier 102 and a second input coupled to a second output of the error amplifier 102. In the implementation, an output of the booster component 402 comprises the boost signal $V_{BOOST}$. For example, in an implementation, the booster component 402 comprises an operational amplifier, or the like, arranged to regulate the boost signal $V_{BOOST}$. In the implementation, differential inputs to the operational amplifier (i.e., boost amplifier 402) comprise differential outputs of the error amplifier 102.

In an implementation, the boost amplifier 402 is arranged to regulate the boost signal $V_{BOOST}$ is such a way that the differential output voltage of the error amplifier 102 is set to zero. For example, in an implementation, the boost amplifier 402 is arranged to receive a balanced differential signal output at the error amplifier 102, where the balanced differential signal comprises a pair of inverted signals (i.e., opposite polarity signals) with substantially equal magnitudes. In such an implementation, the differential outputs of the error amplifier 102 comprise at least a portion of a balanced circuit.

Figure 5:
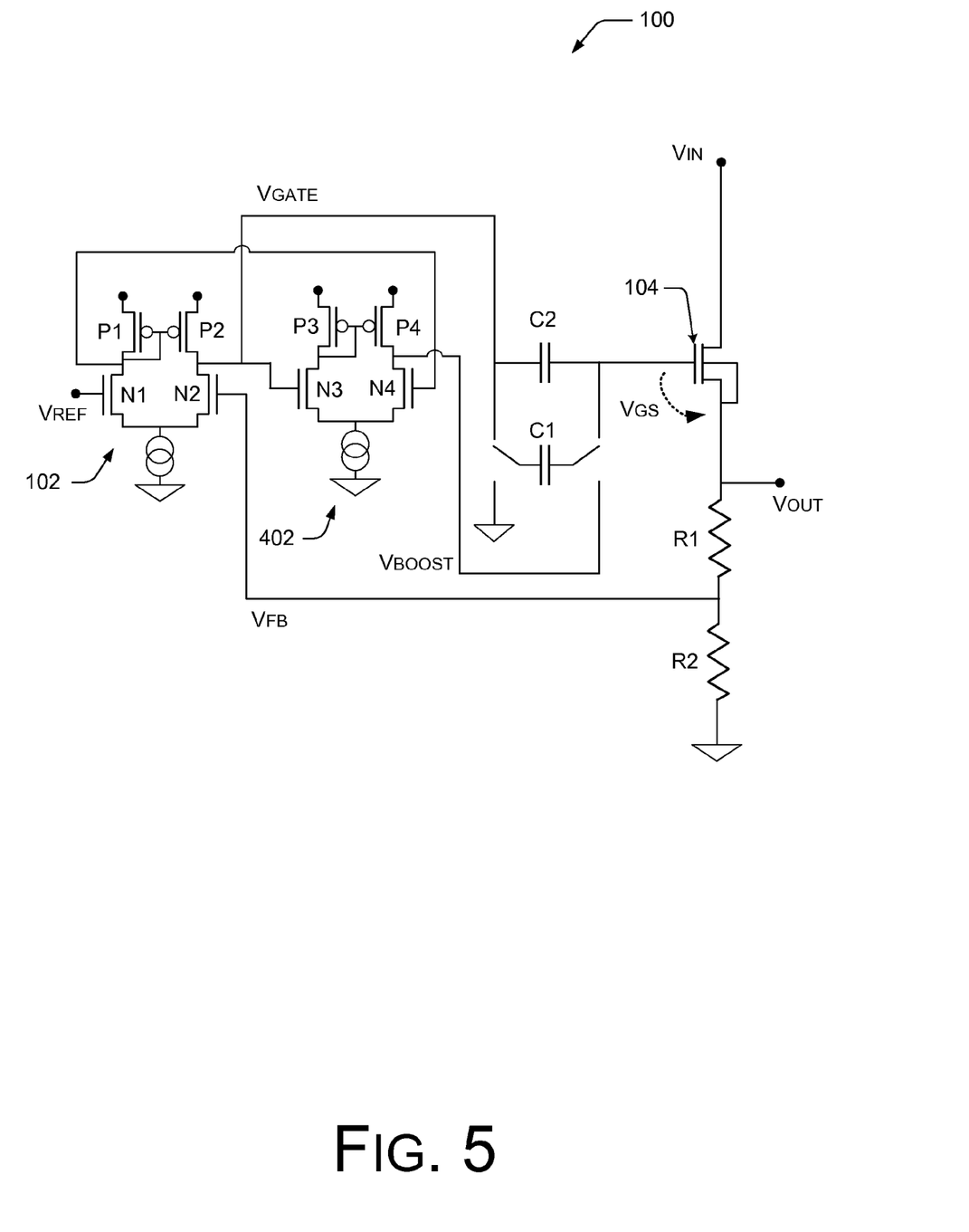
FIG. 5 is a schematic of the example regulator of FIG. 4, showing an example booster amplifier construction, according to an implementation.

FIG. 5 is a schematic of the example regulator 100 of FIG. 4, showing an example booster component (e.g., booster amplifier) 402 construction, according to an implementation. In one implementation, as shown in FIG. 5, one or both of the error amplifier 102 and the booster amplifier 402 comprise single-stage operational amplifiers.

Also as shown in FIG. 5, in various implementations, the booster amplifier 402 is comprised of a symmetric set of complementary metal-oxide-semiconductor (CMOS) transistor pairs (N3, P3 and N4, P4). For example, in an implementation, the error amplifier 102 and the boost amplifier 402 comprise physically and/or electrically equivalent devices.

In various implementations, as shown in FIG. 5, the low frequency loop gain of the regulator 100 comprises a gain of the error amplifier 102 multiplied by a gain of the boost amplifier 402. Such a configuration can provide a high gain and fast load change response. Also, with the configuration shown in FIG. 5, where the error amplifier 102 comprises a single-stage operational amplifier, the boost amplifier 402 does not contribute to high frequency thermal noise of the regulator 100. Thus, the noise of the regulator 100, particularly at high frequencies, is minimized, allowing for broad applications of the regulator 100.

It is to be understood that a regulator 100 may be implemented as a separate component or as part of a system including a regulator 100. The techniques and devices described herein with respect to a regulator 100 is not limited to the configurations shown in FIGS. 1-5, and may be applied to other configurations without departing from the scope of the disclosure. Various implementations of a regulator 100 as described herein, may include fewer components and remain within the scope of the disclosure. Alternately, other implementations of a regulator 100 may include additional components, or various combinations of the described components, and remain within the scope of the disclosure.

Representative Processes

Figure 6:
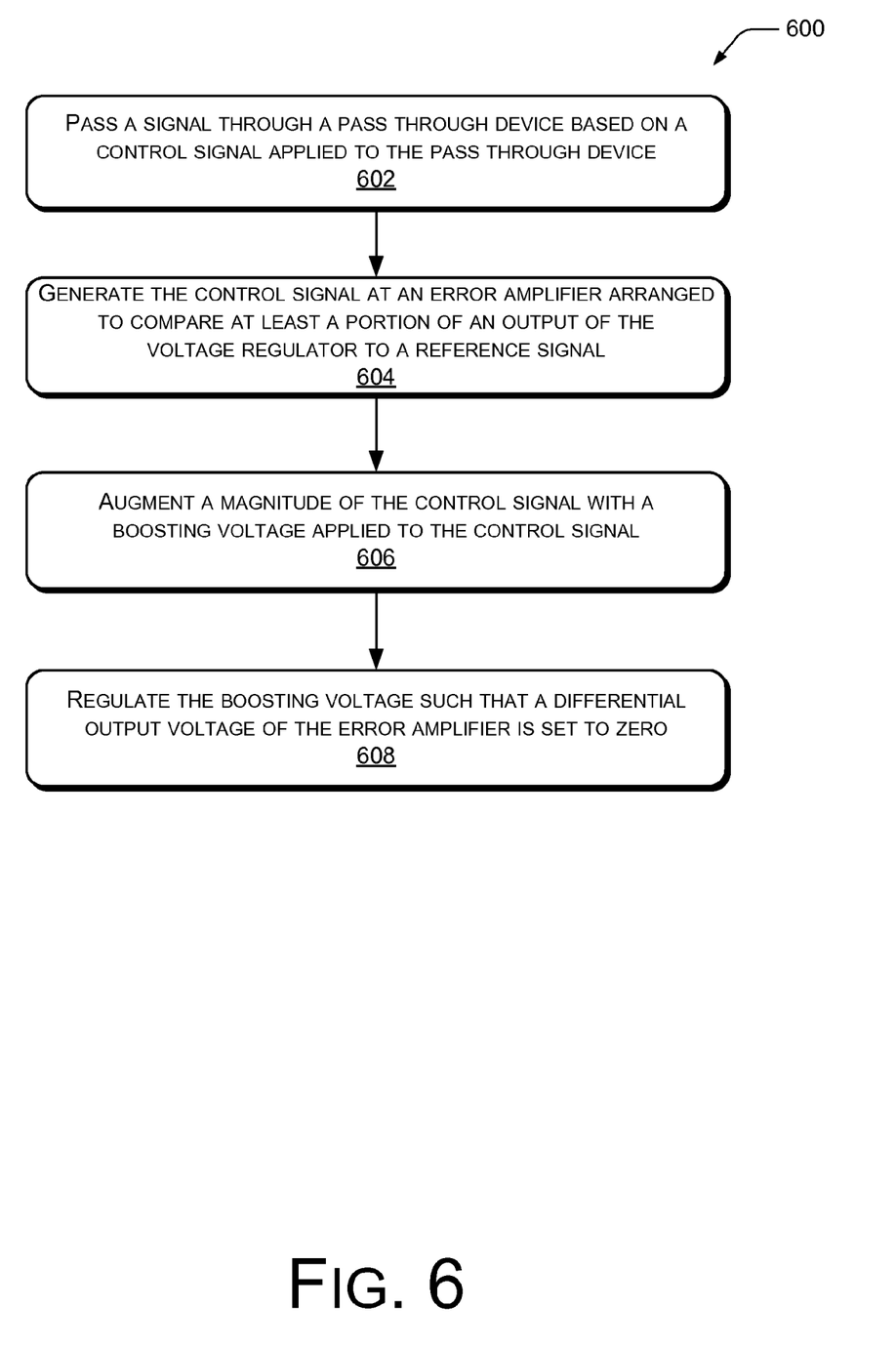
FIG. 6 is a flow diagram illustrating an example process of controlling a regulator, including boosting a gate voltage of the pass through device, according to an implementation.

FIG. 6 illustrates a representative process 600 for controlling a voltage regulator (such as the regulator 100). This includes implementing signal boost techniques and/or devices at the regulator. In an implementation, the voltage regulator comprises a low dropout (LDO) voltage regulator. The process 600 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 602, the process includes passing a signal through a pass through device (such as pass through device 104, for example) based on a control signal (such as control signal $V_{GATE}$, for example) applied to the pass through device. For example, in an implementation, the control signal is applied to the gate of the pass through device and controls the amount of current passed through the pass through device. In one implementation, an input voltage is applied to an input of the pass through device, and the output of the pass through device is a regulated voltage, where the regulated voltage is controlled via the control signal.

In an implementation, the pass through device comprises an n-channel transistor device. For example, the pass through device may be a source-follower device with low output impedance and a gain of approximately 1.

At block 604, the process includes generating the control signal at an error amplifier (such as error amplifier 102, for example) arranged to compare at least a portion of an output of the voltage regulator to a reference signal. In one implementation, the gain of the error amplifier is approximately 60 dB. In alternate implementations, the gain of the error amplifier has other values, sufficient to generate the control signal. In various implementations, the error amplifier comprises a single-stage operational amplifier.

At block 606, the process includes augmenting a magnitude of the control signal with a boosting voltage (such as boosting voltage $V_{BOOST}$, for example) applied to (e.g., fully or partially added to, combined with, etc.) the control signal. In an implementation, the process includes charging a capacitance (such as flying capacitor C1, for example) with the boosting voltage and applying the boosting voltage to the control signal via the capacitance.

In various implementations, the process includes boosting the magnitude of the control signal above the magnitude of the input signal to the pass through device. Additionally or alternately, the process includes boosting the magnitude of the control signal to a value at or above the magnitude of the output of the voltage regulator plus a gate-to-source voltage of the pass through device.

At block 608, the process includes regulating the boosting voltage such that the differential output voltage of the error amplifier is set to zero. In an implementation, the process includes generating the boosting voltage at an operational amplifier (such as boosting amplifier 402, for example). In the implementation, the differential inputs of the operational amplifier are coupled to differential outputs of the error amplifier, respectively. In one implementation, the differential outputs of the error amplifier are set to output a balanced signal. In other words, the differential outputs of the error amplifier are balanced, and are arranged to output signals having equal magnitude and opposite polarity.

In alternate implementations, other techniques may be included in the process 600 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. An apparatus, comprising:
    an amplifier arranged to receive a reference voltage and a feedback voltage and to output a control signal;
    a capacitance arranged to receive a boost signal from the amplifier and to increase a magnitude of the control signal based on the boost signal;
    a pass through device arranged to output a regulated voltage based on the control signal; and
    a boost signal source to provide the boost signal, wherein the boost signal source is arranged to receive a balanced differential signal output at the amplifier, the balanced differential signal comprising a pair of inverted signals with substantially equal magnitudes.

2. The apparatus of claim 1, wherein the pass through device is to output the regulated voltage based on the control signal at a gate of the pass through device.

3. The apparatus of claim 1, wherein the amplifier is arranged to output the control signal based on a difference between the reference voltage and the feedback voltage.

4. The apparatus of claim 1, wherein the boost signal source is arranged to regulate a magnitude of the boost signal.

5. The apparatus of claim 1, wherein the amplifier comprises a single-stage operational amplifier.

6. The apparatus of claim 1, wherein the feedback voltage is based on at least a portion of the regulated voltage.

7. The apparatus of claim 1, wherein the boost signal source comprises an operational amplifier, and differential inputs to the operational amplifier comprise differential outputs of the amplifier.

8. The apparatus of claim 7, wherein the differential outputs of the amplifier comprise at least a portion of a balanced circuit.

9. A voltage regulator, comprising:
an amplifier having a first input coupled to a reference voltage and a second input coupled to a feedback voltage, an output of the voltage regulator based on a control signal output from the amplifier;
a capacitance coupled to a first output of the amplifier and arranged to increase a magnitude of the control signal based on receiving a boost signal; and
a boost amplifier having a first input coupled to the first output of the amplifier and a second input coupled to a second output of the amplifier, an output of the boost amplifier comprising the boost signal;
wherein a first output signal at the first output of the amplifier is substantially equal in magnitude and opposite in polarity to a second output signal at the second output of the amplifier.

10. The voltage regulator of claim 9, further comprising a transistor device arranged to receive an input voltage and to output a regulated voltage based on the control signal.

11. The voltage regulator of claim 10, wherein the transistor device comprises an N-channel pass transistor device.

12. The voltage regulator of claim 9, further comprising a voltage regulation loop coupled to the second input of the amplifier and arranged to provide the feedback voltage, based on the output of the voltage regulator.

13. The voltage regulator of claim 9, further comprising a voltage divider arranged to output the feedback voltage.

14. The voltage regulator of claim 9, wherein a low frequency loop gain of the low drop out voltage regulator comprises a gain of the amplifier multiplied by a gain of the boost amplifier.

15. The voltage regulator of claim 9, wherein the amplifier comprises a single-stage operational amplifier.

16. The voltage regulator of claim 9, wherein the boost amplifier comprises an operational amplifier arranged to regulate the boost signal.

17. The voltage regulator of claim 9, wherein the boost amplifier does not contribute to high frequency thermal noise of the low drop out voltage regulator.

18. The voltage regulator of claim 9, wherein at least one of the amplifier and the boost amplifier are comprised of a symmetric set of complementary metal-oxide-semiconductor (CMOS) transistor pairs.

19. The voltage regulator of claim 9, wherein the amplifier and the boost amplifier comprise electrically equivalent devices.

20. A method of controlling a voltage regulator, comprising:
generating a control signal at an amplifier arranged to compare at least a portion of an output of the voltage regulator to a reference signal;
passing a signal through a pass through device based on the control signal;
adjusting a magnitude of the control signal with a boosting voltage applied to the control signal; and
regulating the boosting voltage to output a zero differential voltage at the amplifier.

21. The method of claim 20, further comprising charging a capacitance with the boosting voltage and applying the boosting voltage to the control signal via the capacitance.

22. The method of claim 20, further comprising boosting the magnitude of the control signal above a magnitude of an input signal to the pass through device.

23. The method of claim 20, further comprising boosting the magnitude of the control signal to a value at or above a magnitude of the output of the voltage regulator plus a gate-to-source voltage of the pass through device.

24. The method of claim 20, further comprising generating the boosting voltage at an operational amplifier, wherein differential inputs of the operational amplifier are coupled to differential outputs of the amplifier, respectively.

25. The method of claim 24, wherein the differential outputs of the amplifier are set to output a balanced signal.

26. A low dropout voltage regulator, comprising:
an n-channel pass through transistor device arranged to receive an input voltage and to output a regulated voltage based on a control signal applied at a gate of the transistor device;
an error amplifier having a first input coupled to a reference voltage and a second input coupled to a feedback voltage, the error amplifier arranged to output the control signal based on a difference between the reference voltage and the feedback voltage;
a flying capacitance coupled to an output of the error amplifier and arranged to increase a magnitude of the control signal via a boost signal; and
a boost amplifier having a first input coupled to a first output of the error amplifier and a second input coupled to a second output of the error amplifier, the boost amplifier arranged to regulate the boost signal based on a differential output voltage of the error amplifier set to zero.

* * * * *